(12) United States Patent
Schluchter et al.

(10) Patent No.: US 7,561,280 B2
(45) Date of Patent: Jul. 14, 2009

(54) DISPLACEMENT MEASUREMENT SENSOR HEAD AND SYSTEM HAVING MEASUREMENT SUB-BEAMS COMPRISING ZEROTH ORDER AND FIRST ORDER DIFFRACTION COMPONENTS

(75) Inventors: William Clay Schluchter, Los Altos, CA (US); Miao Zhu, San Jose, CA (US); Alan B. Ray, Palo Alto, CA (US); Gerry Owen, Palo Alto, CA (US); Carol Courville, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/172,810

(22) Filed: Jul. 14, 2008

(65) Prior Publication Data

US 2008/0304079 A1 Dec. 11, 2008

Related U.S. Application Data

(63) Continuation-in-part of application No. 11/686,855, filed on Mar. 15, 2007.

(51) Int. Cl.
*G01B 11/02* (2006.01)
(52) U.S. Cl. .................................... 356/499
(58) Field of Classification Search ................ 356/488, 356/494, 499, 521
See application file for complete search history.

(56) References Cited

U.S. PATENT DOCUMENTS

| 4,772,119 | A | * | 9/1988 | Bouwhuis et al. | 356/124 |
| 4,979,826 | A | * | 12/1990 | Ishizuka et al. | 356/499 |
| 5,569,913 | A | * | 10/1996 | Ishizuka et al. | 250/237 G |
| 5,661,296 | A | * | 8/1997 | Ishizuka et al. | 250/231.14 |
| 2002/0085210 | A1 | * | 7/2002 | Takayama et al. | 356/499 |
| 2007/0058173 | A1 | * | 3/2007 | Holzapfel | 356/499 |

* cited by examiner

*Primary Examiner*—Michael A Lyons

(57) ABSTRACT

A sensor head for use with a measurement grating is described. The sensor head comprises: a splitter grating configured to split a light beam into first and second measurement beams; a first retroreflector configured to retroreflect the first and second measurement beams toward the measurement grating; and a second retroreflector configured to retroreflect the first and second measurement beams toward the measurement grating. In one embodiment the second measurement beam is diffracted by the measurement grating to form first and second sub-beams and one of the first and second sub-beams comprises a zeroth order diffraction component and a first order diffraction component. In another embodiment, the first and second sub-beams each comprise a zeroth order diffraction component and a first order diffraction component.

21 Claims, 15 Drawing Sheets

DISPLACEMENT MEASUREMENT SENSOR HEAD AND SYSTEM HAVING MEASUREMENT SUB-BEAMS COMPRISING ZEROTH ORDER AND FIRST ORDER DIFFRACTION COMPONENTS

CROSS-REFERENCE TO RELATED APPLICATIONS

The present application is a continuation-in-part application under 37 C.F.R. § 1.53(b) of U.S. patent application Ser. No. 11/686,855 (the 'parent application') to William Clay Schluchter, et al. and titled "Improved Displacement Measurement System" filed on Mar. 15, 2007. Priority under 35 U.S.C. § 120 is hereby claimed from the parent application, and the entire disclosure of the parent application is specifically incorporated herein by reference.

BACKGROUND

Use of laser interferometry is known for precise measurement of small displacements and rotations using a beam of light split into reference and measurement beams. The measurement beam is reflected from a mirror mounted on a movable object and is combined with the reference beam reflected from a stationary object to generate a phase difference. The phase difference is proportional to the amount of displacement made between the reflector of the reference beam and the reflector of the measurement beam.

In many applications, the measurement beam path passes through air. In some applications, a double pass beam path can permit cancellation of propagation angles between the measurement beam path and the reference beam path. The double pass beam path increases the beam path length. Furthermore, the optical path length of the light can be more than four times the stroke of the moving object. In wafer exposure tools used in integrated circuit lithography, the optical path length can approach two meters. The long beam path presents a challenge for the measurement because the air through which the light travels must be well controlled in terms of temperature, pressure and gas composition. Because temperature, pressure and gas composition all affect a refractive index of air, a change or inconsistency in any of them presents as a phase shift and therefore a measurement error or measurement uncertainty. In many applications, the control of the index of refraction of air is becoming a performance limiting factor.

Among other considerations, it is desirable to reduce a path length of light travel in interferometry displacement measurement applications.

BRIEF DESCRIPTION OF THE DRAWINGS

An understanding of the present teachings can be gained from the following detailed description taken in conjunction with the accompanying drawings. The features are not necessarily drawn to scale. Wherever practical, like reference numerals refer to like features.

DETAILED DESCRIPTION

In the following detailed description, for purposes of explanation and not limitation, representative embodiments disclosing specific details are set forth in order to provide an understanding of embodiments according to the present teachings. However, it will be apparent that other embodiments according to the present teachings that depart from the specific details disclosed herein remain within the scope of the appended claims. Moreover, descriptions of well-known apparatus and methods may be omitted so as to not obscure the description of the representative embodiments. Such methods and apparatus are clearly within the scope of the present teachings.

The representative embodiments are described in conjunction with a photolithography system used in semiconductor processing. Applicants emphasize that the present teachings have other applications where precise displacement measurements are desired, if not required. Notably, application of the present teachings is contemplated to other lithography systems (e.g., flat panel display lithography or integrated optical device lithography); methods, apparatuses and systems for the production of lithographic masks or reticles; methods apparatuses and systems that measure feature dimensions or feature placement in semiconductor, flat panel display or integrated optical device manufacture, and systems that inspect semiconductor devices, flat panel displays, or integrated optical devices. Again, it is emphasized that these are merely illustrative applications and are not intended to be limiting. Other applications of the present teachings and equivalents thereof are contemplated.

Figure 1:
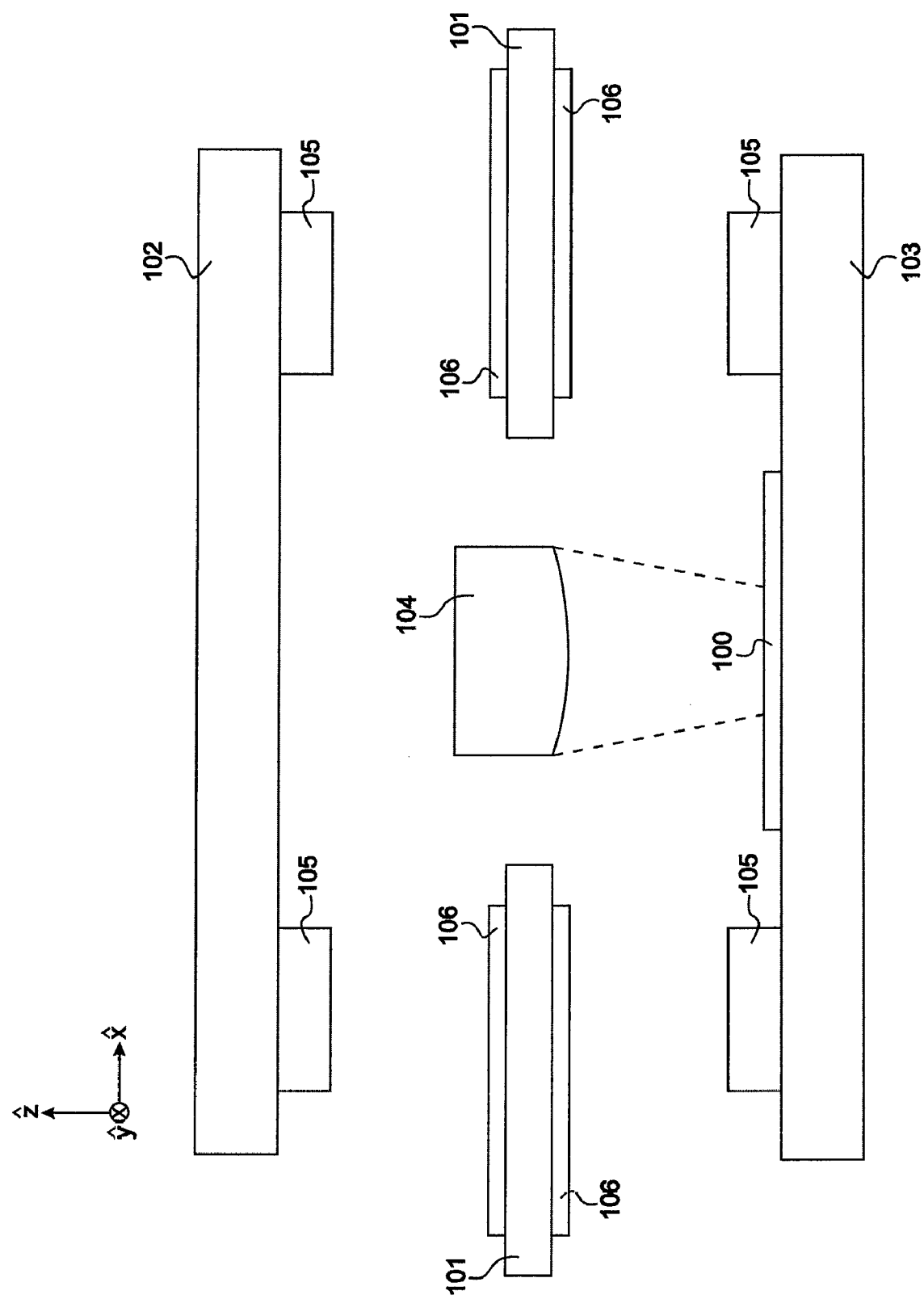
FIG. 1 shows a photolithography application in accordance with a representative embodiment.

FIG. 1 is a side view of a portion of a photolithography system used as part of a process for manufacture of a semiconductor wafer 100. The photolithography system includes a stationary reference frame 101, a mask stage 102, a wafer stage 103, and projection lens 104. The photolithography system benefits from inclusion of one or more sensor heads 105 and measurement gratings 106 as elements of a displacement measurement apparatus according to the present teachings. FIG. 1 shows the sensor head 105 affixed to the moving stage 102, 103 and the measurement grating 106 affixed to the stationary reference frame 101. It is equally appropriate to affix the sensor head 105 to the stationary reference frame 101 and the measurement grating 106 to the moving stage 102, 103.

Figure 2:
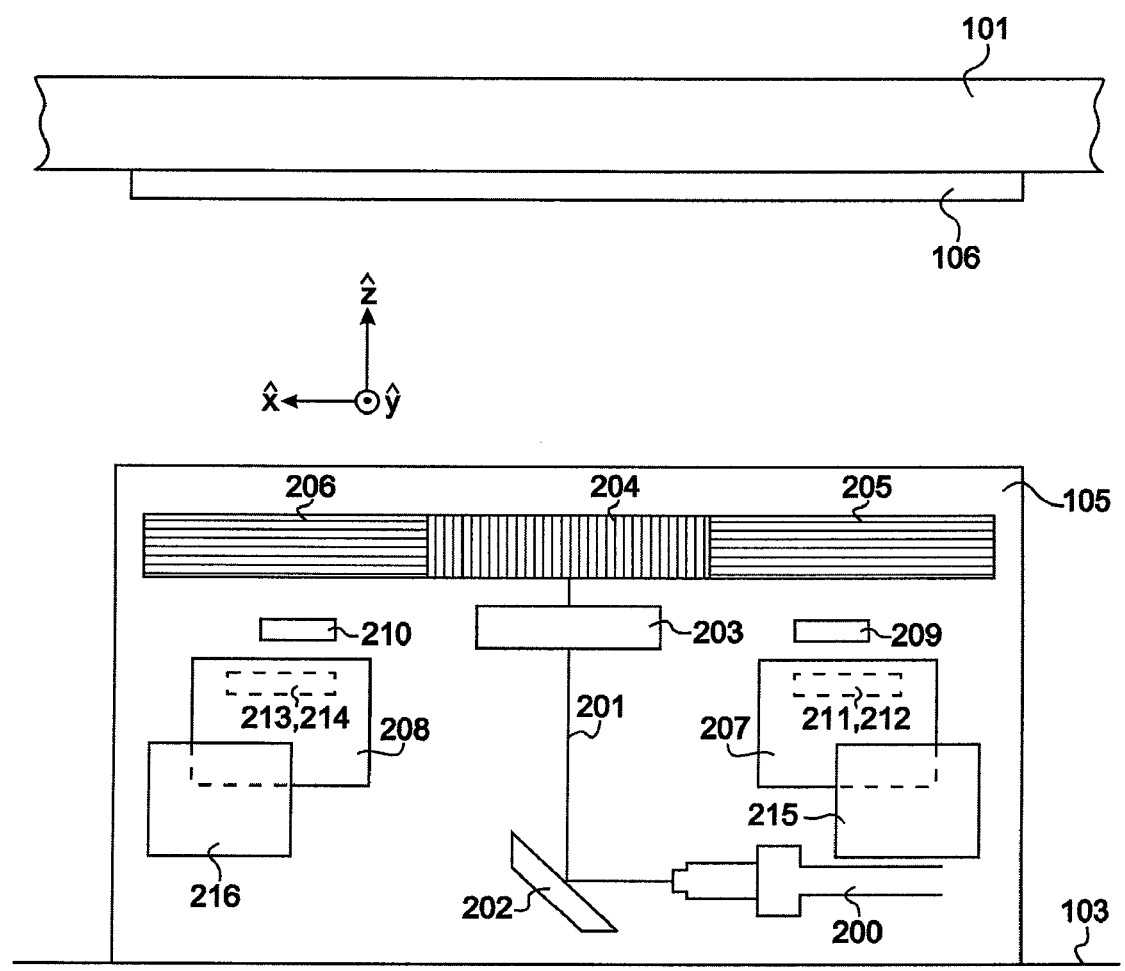
FIG. 2 shows a sensor head in the x-z plane that is part of a distance measurement system in accordance with a representative embodiment.

FIG. 2 shows a more detailed side view of a specific embodiment of the sensor head 105 and the measurement grating 106 according to the present teachings shown in an x-z plane. The sensor head 105 includes a light source or delivery fiber 200 that provides a light beam 201 having one optical frequency. The light beam 201 is shown as reflected from a mirror 202 before impinging on splitter grating 204. In the specific embodiment, the reflection from the mirror is an artifact from the desire to orient the light source 200 parallel to wafer stage 103. An orientation of the light source 200 orthogonal to the wafer stage is also appropriate. Such orthogonal orientation may not call for the mirror 202 to further direct the light.

A lens, such as collimator 203, is disposed between the mirror 202 or light source 200 and the splitter grating 204 to collimate the light beam as appropriate before it illuminates the splitter grating 204. The lens or collimator 203 is not required if the light beam is already sufficiently focused for purposes of the specific application. In another embodiment, a single optical element, such as a Fresnel lens, may be used to both split and focus the light beam instead of using separate splitter 204 and collimator 203 elements. Side gratings 205, 206 are on opposite ends of the splitter grating 204. In a specific embodiment, the splitter grating 204 is contiguous with the two side gratings 205, 206 and has a substantially similar pitch. Also in a specific embodiment, the splitter grating 204 is defined by a groove orientation that is orthogonal to the groove orientation of the side gratings 205, 206. In a specific embodiment, the side gratings 205, 206 have similar groove orientations.

The sensor head 105 further includes first and second retroreflectors 207, 208, first and second focusing lenses 209, 210, first, second, third and fourth polarizer/retarders 211, 212, 213, 214 and first and second detector arrays 215, 216. The arrangement and location of the first and second detector arrays 215, 216 is selected to capture sub-beams for making measurements. For example, in certain embodiments, the first and second detector arrays comprise a 3×1 array of detector elements, with the individual detector elements placed at a selected x,z coordinate and along the y-axis of the coordinate system shown. As such, one detector element is offset in the +y-direction from the plane of the page, one detector element is offset in the −y-direction from the plane of the page, and one detector element is located between these detector elements. Because the trajectories of the sub-beams may vary in x-coordinate, the 3×1 array is located to capture the sub-beams. Alternatively, a 3×2 detector array comprising two of the 3×1 detector arrays may be used to capture sub-beams with different trajectories in the x-direction and the y-direction. Finally, while detector arrays are described, individual optoelectronic detectors and integrated multi-pixel detectors are contemplated. The type, number and arrangement should be apparent after review of the present disclosure.

In an alternative embodiment, the functions provided by the side gratings 205, 206 and focusing lenses 209, 210 are incorporated into a single optical element.

The retroreflectors 207, 208 reflect light antiparallel to the impinging light and, in specific embodiments, are cube corners, cat's eyes, or other type of known retroreflector. The term "antiparallel" as used herein refers to the condition of light beams being parallel and propagating in opposite directions. Each retroreflector 207, 208, lens 209, 210, and detector array 215, 216 is associated with a respective one of side gratings 205, 206 and in a specific embodiment there are two polarizer/retarders 211, 212 and 213, 214 associated with each side grating 205, 206.

Figure 3:
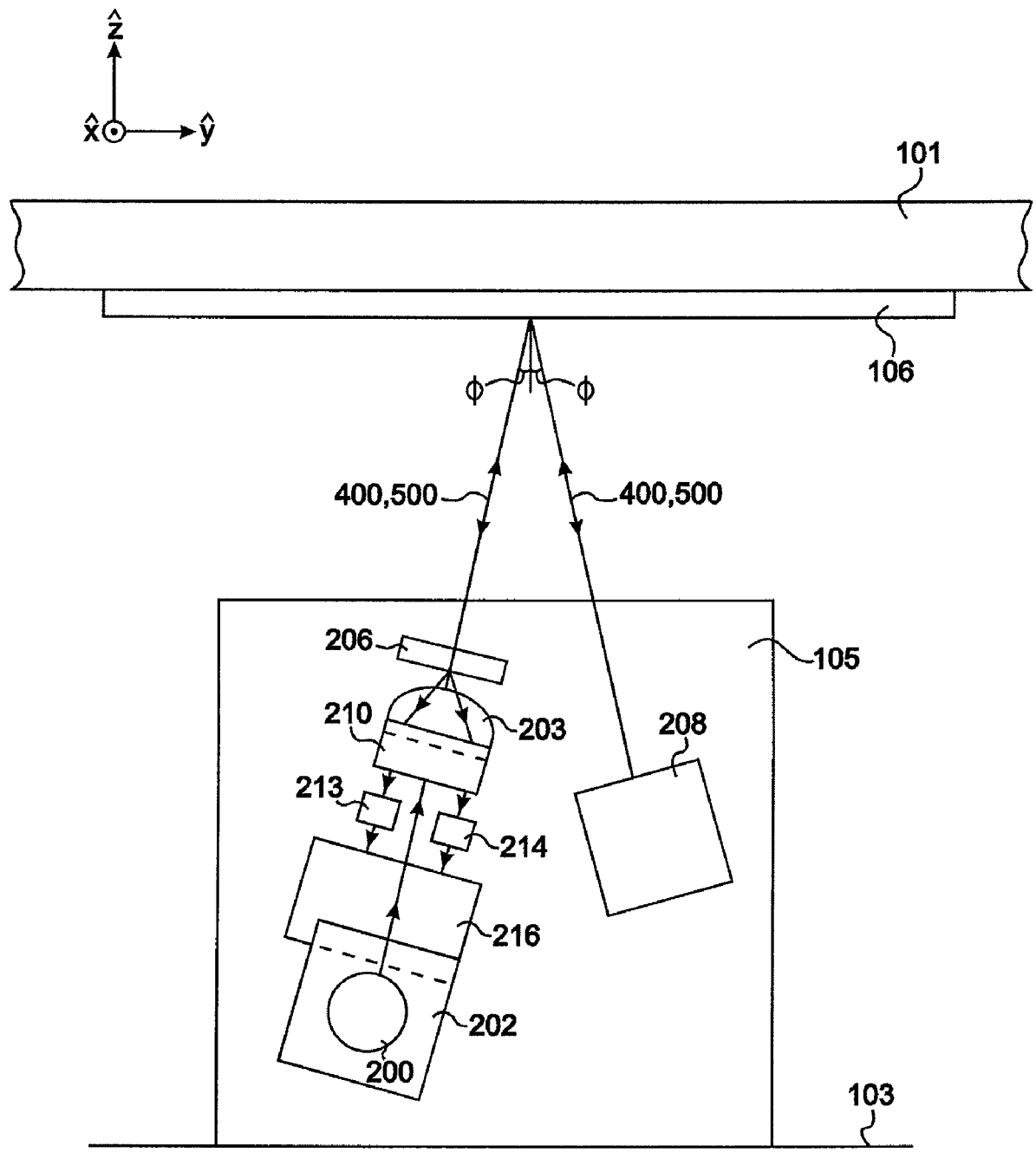
FIG. 3 shows a side view of the representative embodiment of FIG. 2 in the y-z plane and showing a beam path.

FIG. 3 shows a side view of the sensor head 105 and the measurement grating 106 according to the present teachings shown in the y-z plane. The mirror 202, collimator 203, and splitter grating 204 are disposed somewhat central to the x-z plane of the sensor head 105 and aligned with each other. The first and second side gratings 205, 206 are contiguous with and disposed on either side of the splitter grating 204. On either side of the sensor head 105, respective ones of the lenses 210, 209, the polarizer/retarder pairs 213, 214 and 211, 212, and the detector arrays 216, 215 are generally aligned and slightly canted relative to the x-y plane defined by the stage 103 or 102 to which the sensor head is affixed. The retroreflectors 208, 207 are separated from the other components in the y-direction and are also slightly canted relative to the x-y plane. The retroreflectors 208, 207 are offset from one another along the x-axis as shown in FIGS. 2 and 3. Similarly, the lenses 210, 209, polarizer/retarder pairs 213, 214 and detector arrays 216, 215 are offset from one another along the x-axis.

The light source 200 and mirror 202 are spatially arranged and configured to cause a light beam 201 to be incident on splitter grating 204 in a direction of incidence orthogonal to the x-z plane. The splitter grating 204 divides the light beam 201 and forms two separate measurement channel light beams that propagate at angle α relative to the angle of incidence. The two separate light beams that emerge from the splitter grating 204 are herein referred to as first and second measurement beams 400 and 500.

FIGS. 4A-5D show a scanner head 205 and a measurement grating 106 according to representative embodiments. Light beam 201 is incident on splitter grating 204. Splitter grating 204 diffracts a portion of the light beam 201 toward the measurement grating 106 as the first measurement beam 400, and diffracts another portion of the light beam toward the measurement grating 106 as the second measurement beam 500. As described in connection with representative embodiments below, measurement grating 106 subjects the measurement beams 400, 500 to zeroth order diffraction (specular reflection) or first order diffraction to form two respective sub-beams from each of the measurement beams 400, 500. The paths of sub-beams formed by the diffraction of the first measurement beam 400 are described in connection with FIGS. 4A-4D; and the paths of the sub-beams of the second measurement beam 500 are described in connection with FIGS. 5A-5D.

The sub-beams of the first and second measurement beams 400, 500 that are incident on the first and second detector arrays 215, 216 may be subject only to zeroth order diffraction, or may be subject only to first order diffraction, or may be subject to both a zeroth order diffraction before or after a first order diffraction. The sub-beams are characterized herein by the order of the diffractions to which they are subjected. For example, a sub-beam that is first reflected (zeroth order diffraction) and then diffracted (first order diffraction) by the measurement grating 106 is characterized as a (0,1) sub-beam. Similarly, a sub-beam that has twice been subject to a first-order diffraction before being incident on one of the detectors 215, 216 is characterized as a (1,1) sub-beam.

As described in the parent application, homodyne displacement detection systems benefit from two sub-beams being incident on each detector array 215, 216 in order to obtain a directional sense of the change in position. In embodiments described in the parent application, side gratings 205, 206 were used to provide the desired number of sub-beams; and as will become clearer as the present description continues, in certain embodiments, side gratings 205, 206 are useful to achieve that end as well. However, and as will also become clearer as the description continues, side gratings 205, 206 may be foregone as the four sub-beams can be garnered without additional diffraction by the side gratings 205, 206.

Figure 4A:
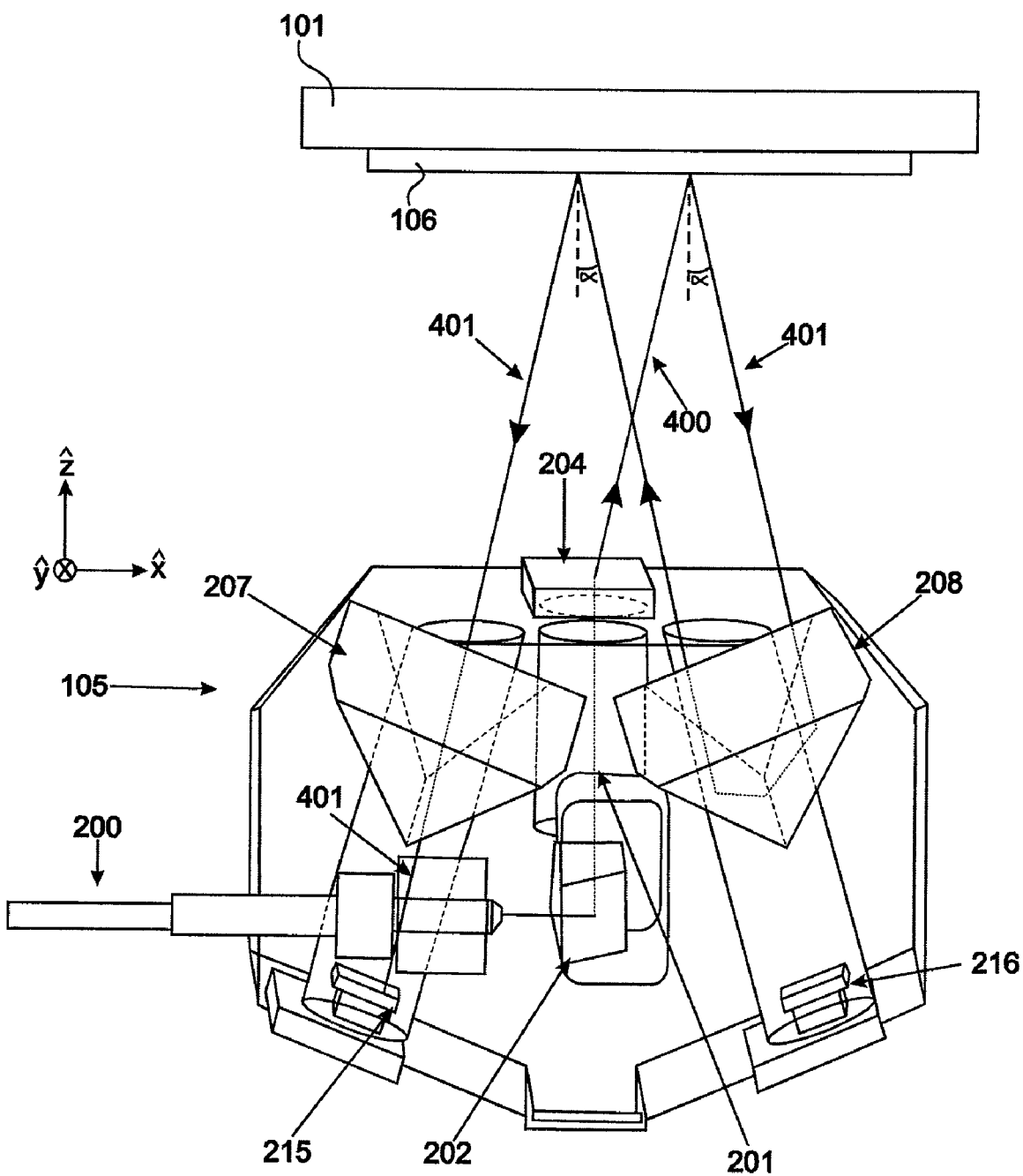
FIGS. 4A through 4D show a scanner head (shown in partial cut-away), a measurement grating and the optical paths of measurement sub-beams in accordance with a representative embodiment.

Turning initially to FIG. 4A, the light beam 201 is incident on the splitter grating 204. The splitter grating 204 diffracts a portion of the light beam 201 toward a first location 405 on the measurement grating 106 as the first measurement beam 400. The first measurement beam is incident on the measurement grating 106 at an angle of incidence α, and the measurement grating 106 subjects a portion of the first measurement beam 400 to a zeroth order diffraction (specular reflection) to provide a sub-beam 401 of the first measurement beam. Measurement grating 106 reflects sub-beam 401 at an angle of reflection equal to the angle of incidence α. The sub-beam 401 is reflected by the second retroreflector 208 and emerges antiparallel to its incident path to the second retroreflector 208.

The sub-beam 401 is incident upon the measurement grating 106 a second time also at an angle of incidence equal to angle of incidence α. Measurement grating 106 subjects sub-beam 401 to a second zeroth order diffraction in which sub-beam 401 is reflected at an angle of reflection equal to angle of incidence α. The sub-beam 401 passes behind the first retroreflector 207 and is incident on the first detector array 215. A lens (not shown in FIG. 4A) may be used to focus sub-beam 401 on first detector array 215. Because the measurement grating 106 subjects the sub-beam beam 401 to two successive zeroth-order diffractions, sub-beam 401 is referred to herein as a (0, 0) sub-beam of the first measurement beam 400.

Figure 4B:
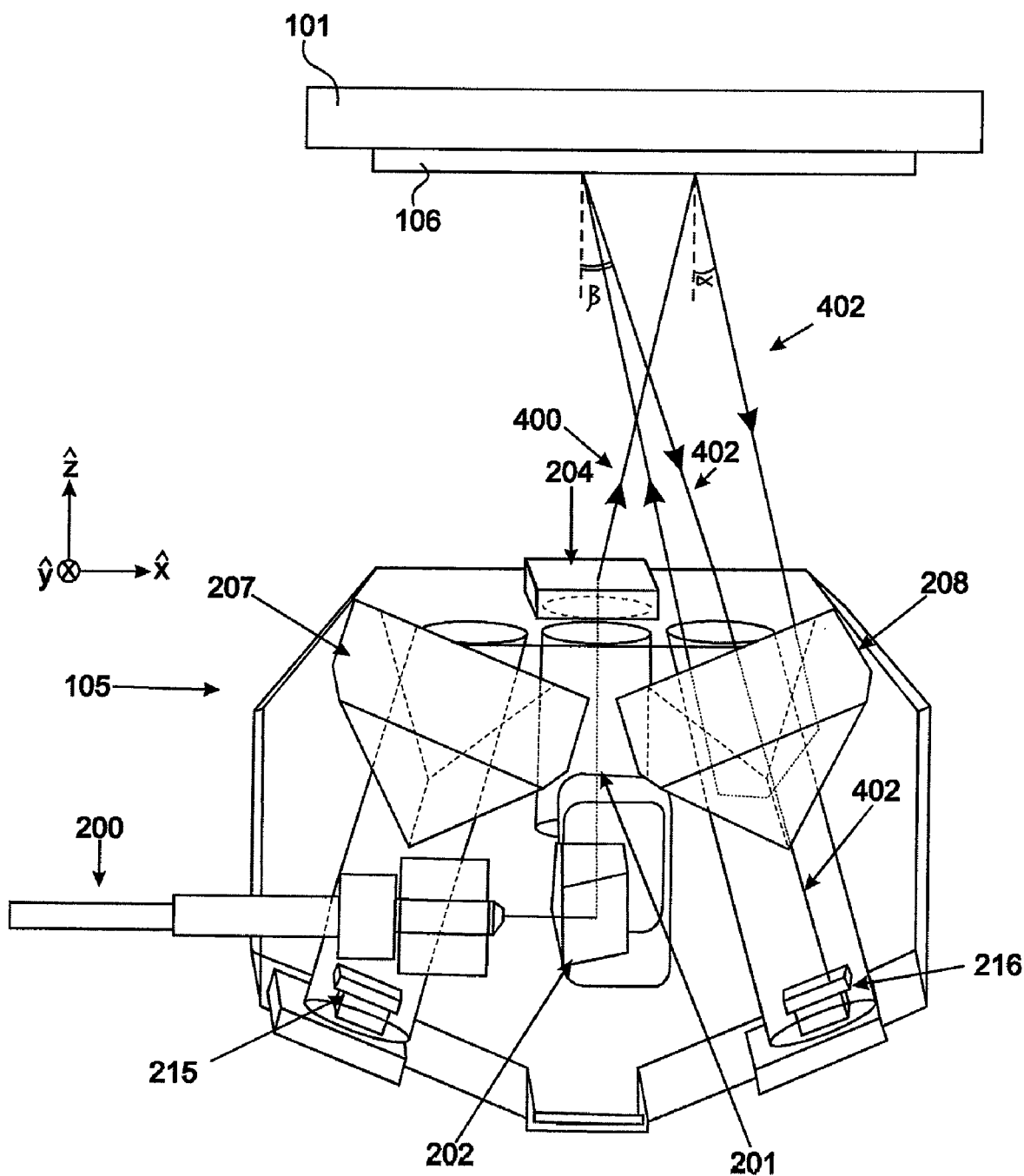

Turning to FIG. 4B, the measurement grating 106 subjects a portion of the first measurement beam 400 to a zeroth order diffraction to provide a sub-beam 402 of the first measurement beam 400. Measurement grating 106 reflects sub-beam 402 at an angle of reflection equal to the angle of incidence α. The sub-beam 402 is retroreflected by the second retroreflector 208 and emerges antiparallel as shown. The sub-beam 402 is incident on the measurement grating 106 a second time. Measurement grating 106 subjects sub-beam 420 to a first order diffraction. The measurement grating diffracts the sub-beam 402 at an angle of diffraction β. Sub-beam 402 passes behind the second retroreflector 208 and is incident on the second detector array 216. A lens (not shown in FIG. 4B) may be used to focus sub-beam 402 on second detector array 216. Because measurement grating 106 subjects the sub-beam 402 to a zeroth-order diffraction and then a first-order diffraction, sub-beam 402 is referred to herein as a (0, 1) sub-beam of the first measurement beam 400.

Figure 4C:
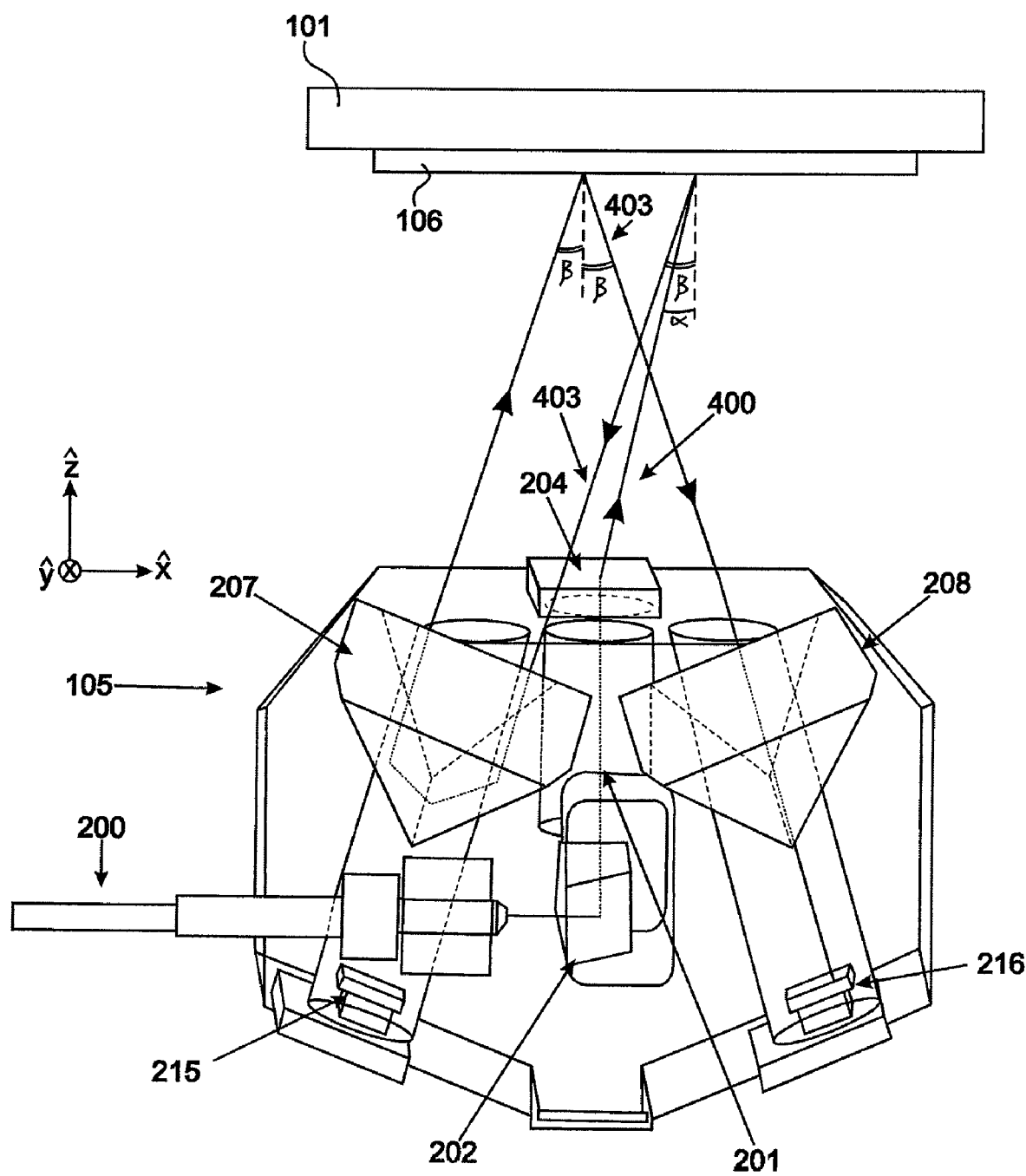

Turning to FIG. 4C, measurement grating 106 subjects a third portion of the first measurement beam 400 to a first order diffraction to provide a sub-beam 403 of the first measurement beam. Measurement grating 106 diffracts sub-beam 403 at an angle of diffraction β. The sub-beam 403 is retroreflected by first retroreflector 207 and emerges antiparallel as shown. The sub-beam 403 is incident on the measurement grating 106 a second time at angle of incidence equal to angle of diffraction β. Measurement grating 106 subjects sub-beam 403 to a zeroth order diffraction in which the sub-beam 403 is reflected at an angle of reflection equal to angle of incidence β. The sub-beam 403 passes behind the second retroreflector 208 and is incident on the second detector array 216. A lens (not shown in FIG. 4C) may be used to focus sub-beam 403 on second detector array 216n. Because measurement grating 106 subjects the sub-beam 403 to a first-order diffraction and then a zeroth order diffraction, sub-beam 403 is referred to herein as a (1,0) sub-beam of the first measurement beam 400.

Figure 4D:
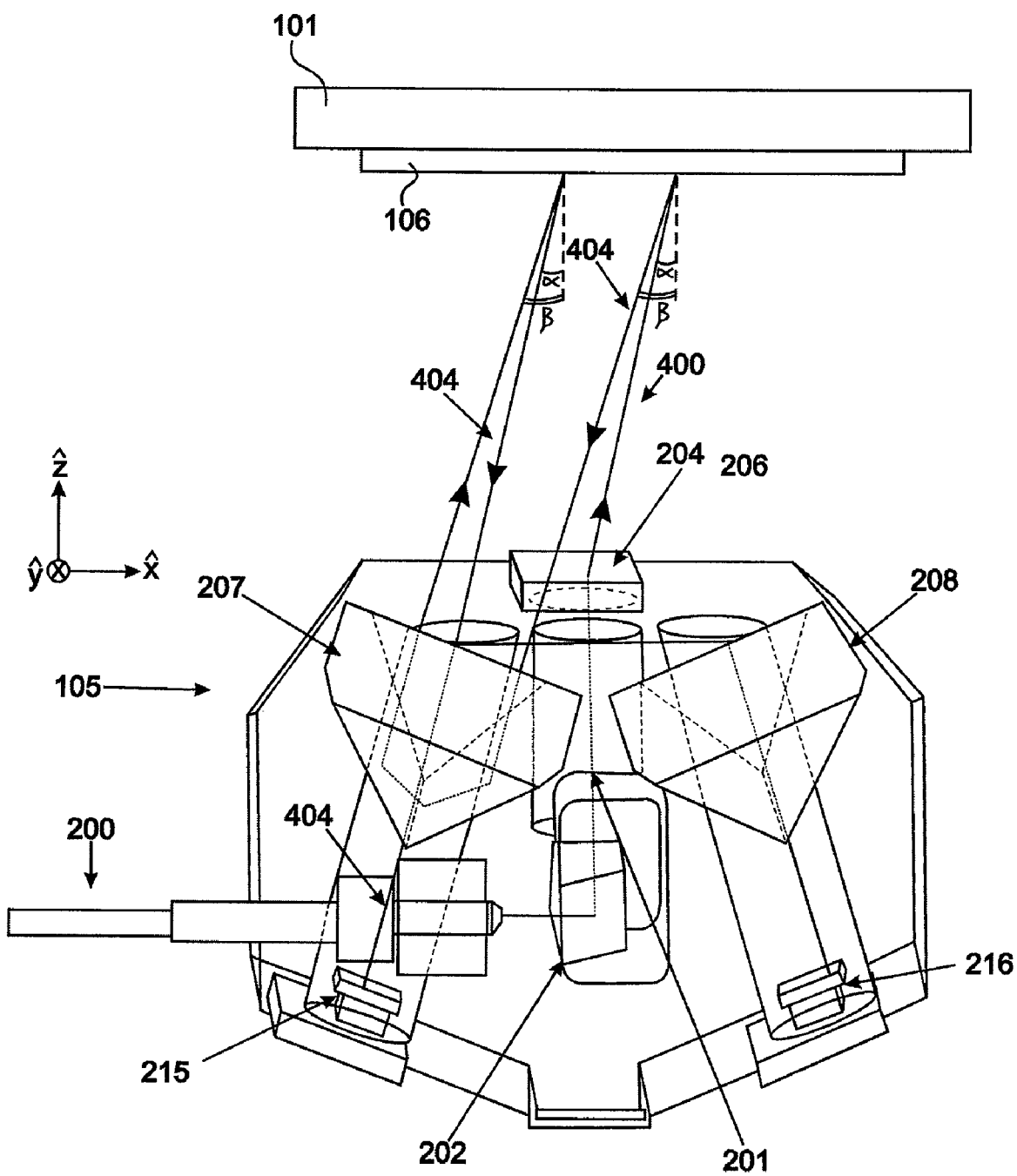

Turning to FIG. 4D, measurement grating 106 subjects a fourth portion of the first measurement beam 400 to a first order diffraction to provide a sub-beam 404 of the first measurement beam 400. Measurement grating 106 diffracts sub-beam 404 at an angle of diffraction β. The sub-beam 404 is retroreflected by the first retroreflector 207 and emerges antiparallel as shown. The sub-beam 404 is incident on measurement grating 106 a second time at an angle of incidence equal to angle of diffraction β. Measurement grating 106 subject sub-beam 404 to another first order diffraction in which sub-beam 404 is diffracted at an angle of diffraction equal to angle of incidence α. The sub-beam 404 passes behind the first retroreflector 207 and is incident on the first detector array 215. A lens (not shown in FIG. 4D) may be used to focus sub-beam 404 on first detector array 215. Because measurement grating 106 subjects the sub-beam 404 to two successive first-order diffractions, sub-beam 404 is referred to as a (1,1) sub-beam of the first measurement beam 400.

FIGS. 5A-5D show a scanner head (shown in partial cutaway), a measurement grating 106 and the optical paths of sub-beams of first and second measurement beams 400, 500 in accordance with a representative embodiment. The paths of the sub-beams of the second measurement beam 500 are described in connection with FIGS. 5A-5D. Many of the details described in connection with the representative embodiments of FIGS. 4A-4D are common to the presently described embodiments, Some common details are not repeated to avoid obscuring the description of the present embodiments.

Figure 5A:
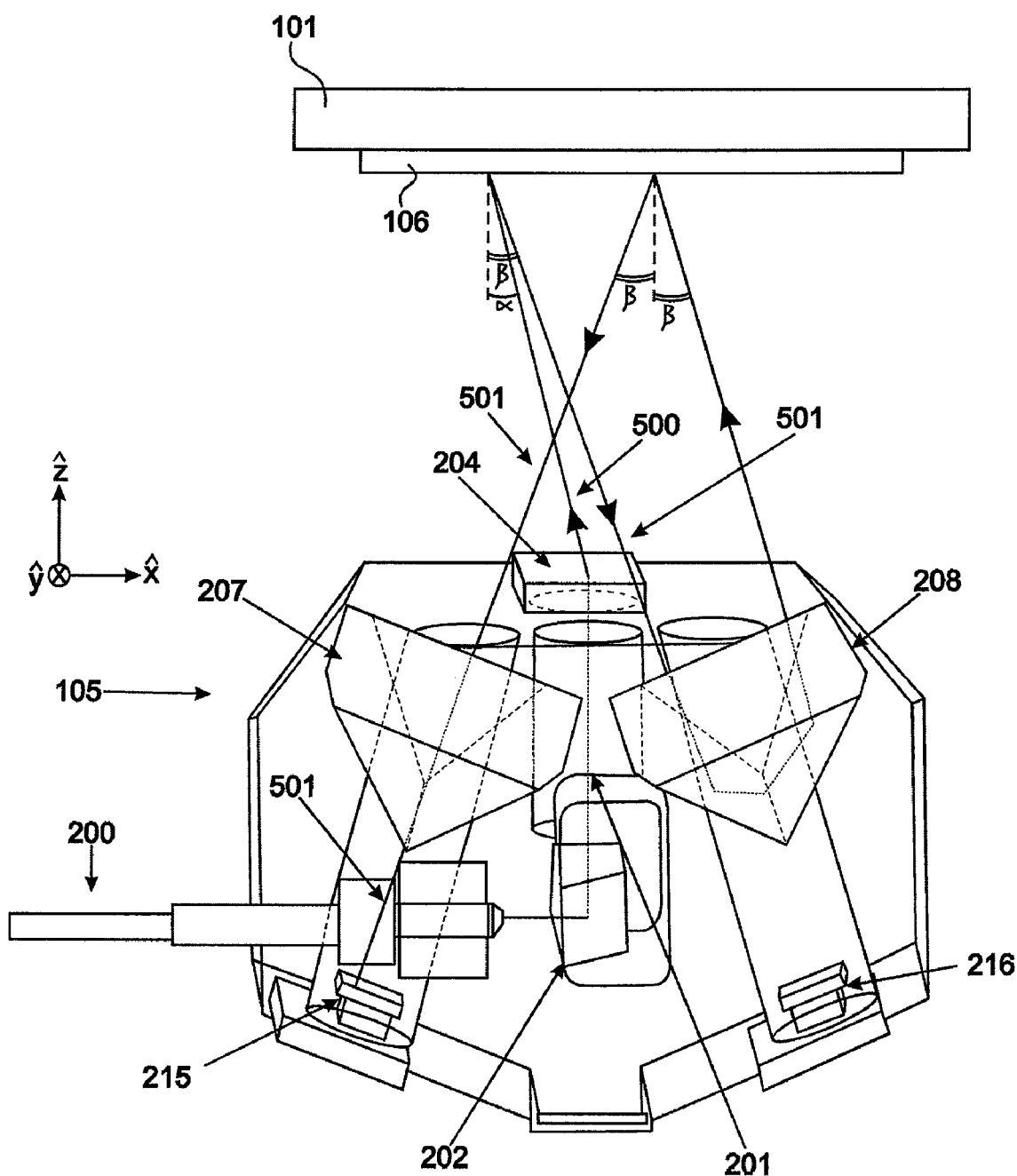
FIGS. 5A through 5D show a scanner head (shown in partial cut-away) and a measurement grating and the optical paths of measurement sub-beams in accordance with a representative embodiment.

Turning to FIG. 5A, the light beam 201 is incident on the splitter grating 204. The splitter grating 204 diffracts a portion of the incident light beam 201 towards a second location 505 on the measurement grating 106 as the second measurement beam 500. The second measurement beam 500 is incident on measurement grating 106 at an angle of incidence α, and the measurement grating subjects a first portion of the second measurement beam to a first order diffraction to provide a sub-beam 501 of the first measurement beam 500. Measurement grating 106 diffracts sub-beam 501 at an angle of diffraction β. The sub-beam 501 is retroreflected by the second retroreflector 208 and emerges antiparallel as shown. The sub-beam 501 is incident on the measurement grating 106 a second time at an angle of incidence equal to angle of diffraction β. The measurement grating subjects sub-beam 501 to a zeroth order diffraction in which sub-beam 501 is reflected at an angle of reflection equal to angle of incidence β. The sub-beam 501 passes behind the first retroreflector 207 and is incident on the first detector 215. A lens (not shown in FIG. 5A) may be used to focus sub-beam 501 on first detector array 215. The sub-beam 501 is referred to as a (1,0) sub-beam of the first measurement beam 500.

Figure 5B:
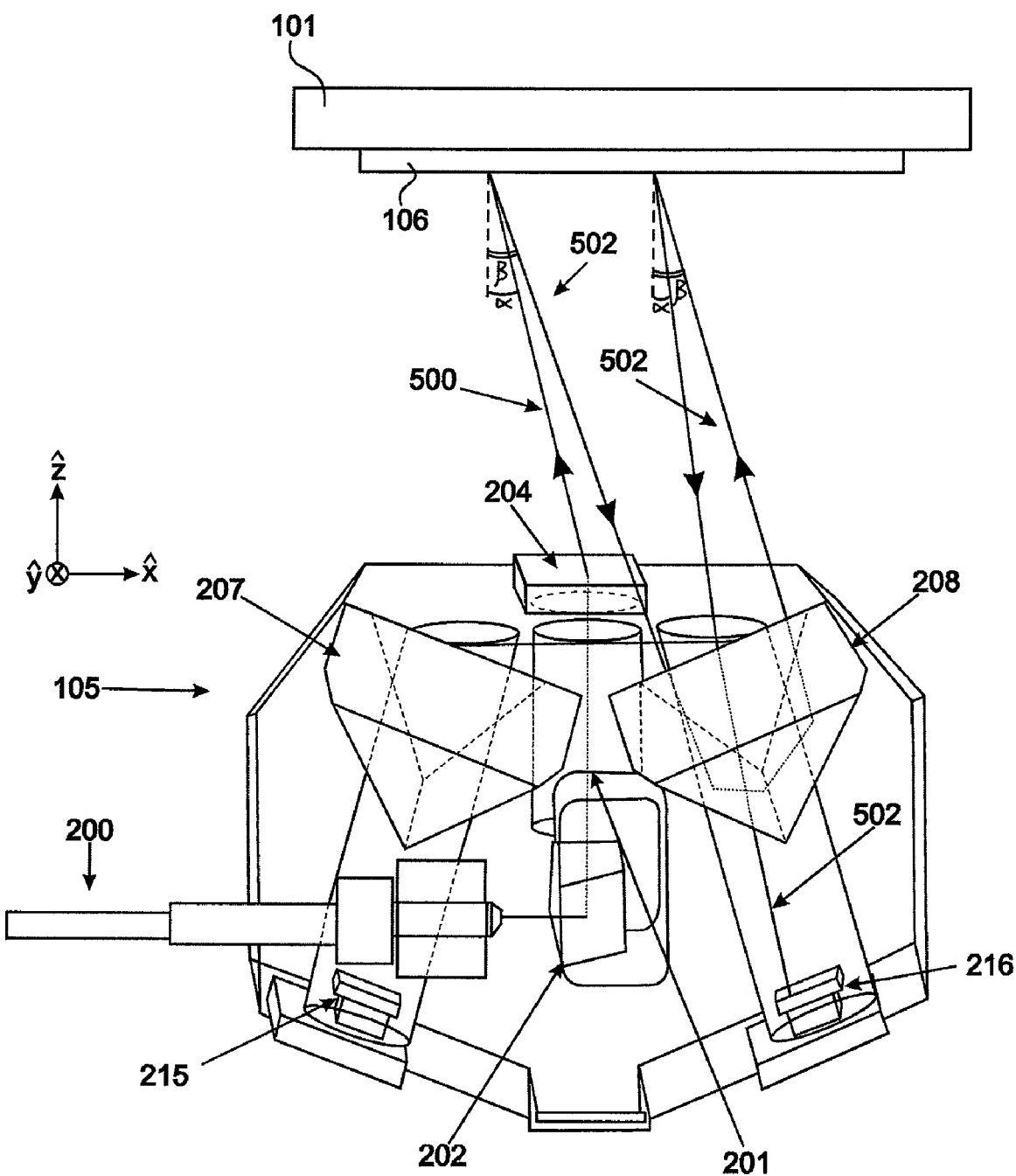

Turning to FIG. 5B, the measurement grating 106 subjects a second portion of second measurement beam 500 to a first order diffraction to provide a sub-beam 502 of second measurement beam 500. Measurement grating 106 diffracts sub-beam 502 at an angle of diffraction β. The sub-beam 502 is retroreflected by second retroreflector 208 and emerges antiparallel as shown. The sub-beam 502 is incident a second time on the measurement grating at an angle of incidence equal to angle of diffraction β. Measurement grating 106 subjects sub-beam 502 to a first order diffraction in which sub-beam 502 is diffracted at an angle of diffraction equal to angle of incidence α. The sub-beam 502 passes behind the second retroreflector 208 and is incident on the second detector array 216. A lens (not shown in FIG. 5B) may be used to focus sub-beam 502 on second detector array 216. The sub-beam 502 incident on the second detector 216 is referred herein to as a (1,1) sub-beam of the second measurement beam 500.

Figure 5C:
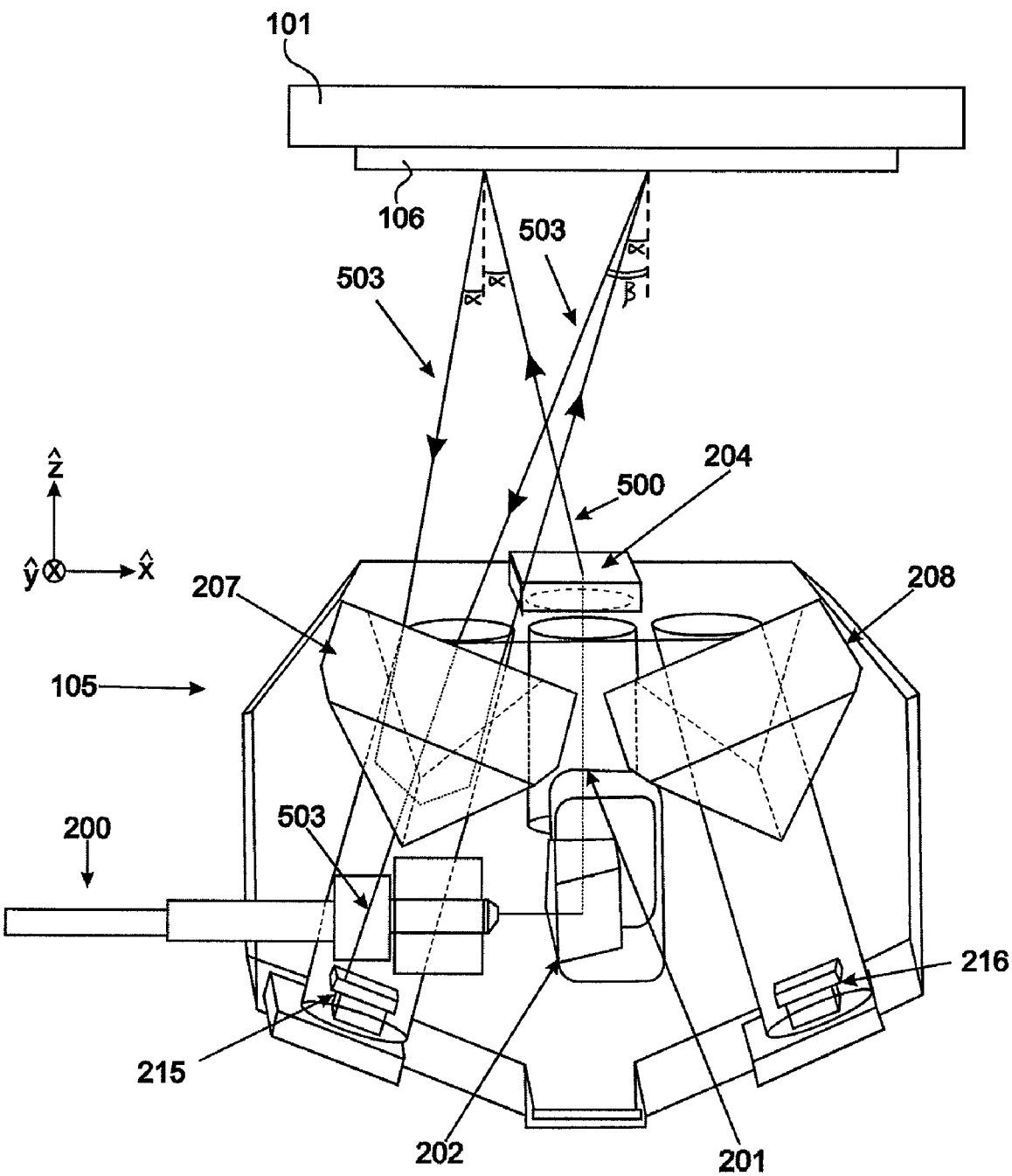

Turning to FIG. 5C, the measurement grating 106 subjects a third portion of second measurement beam 500 to a zeroth order diffraction to provide a sub-beam 503. Measurement grating 106 reflects sub-beam 503 at an angle of reflection equal to angle of incidence α. The sub-beam 503 is retroreflected by first retroreflector 207 and emerges antiparallel as shown. The sub-beam 503 is incident on the measurement grating 106 a second time at an angle of incidence equal to angle of incidence α. The measurement grating subjects sub-beam 503 to a first order diffraction in which sub-beam is diffracted at an angle of diffraction β. The sub-beam 503 passes behind the first retroreflector 207 and is incident on the first detector array 215. A lens (not shown in FIG. 5C) may be used to focus sub-beam 503 on first detector array 215. The sub-beam 503 incident on the first detector 215 is referred to herein as a (0,1) sub-beam of the second measurement beam 500.

Figure 5D:
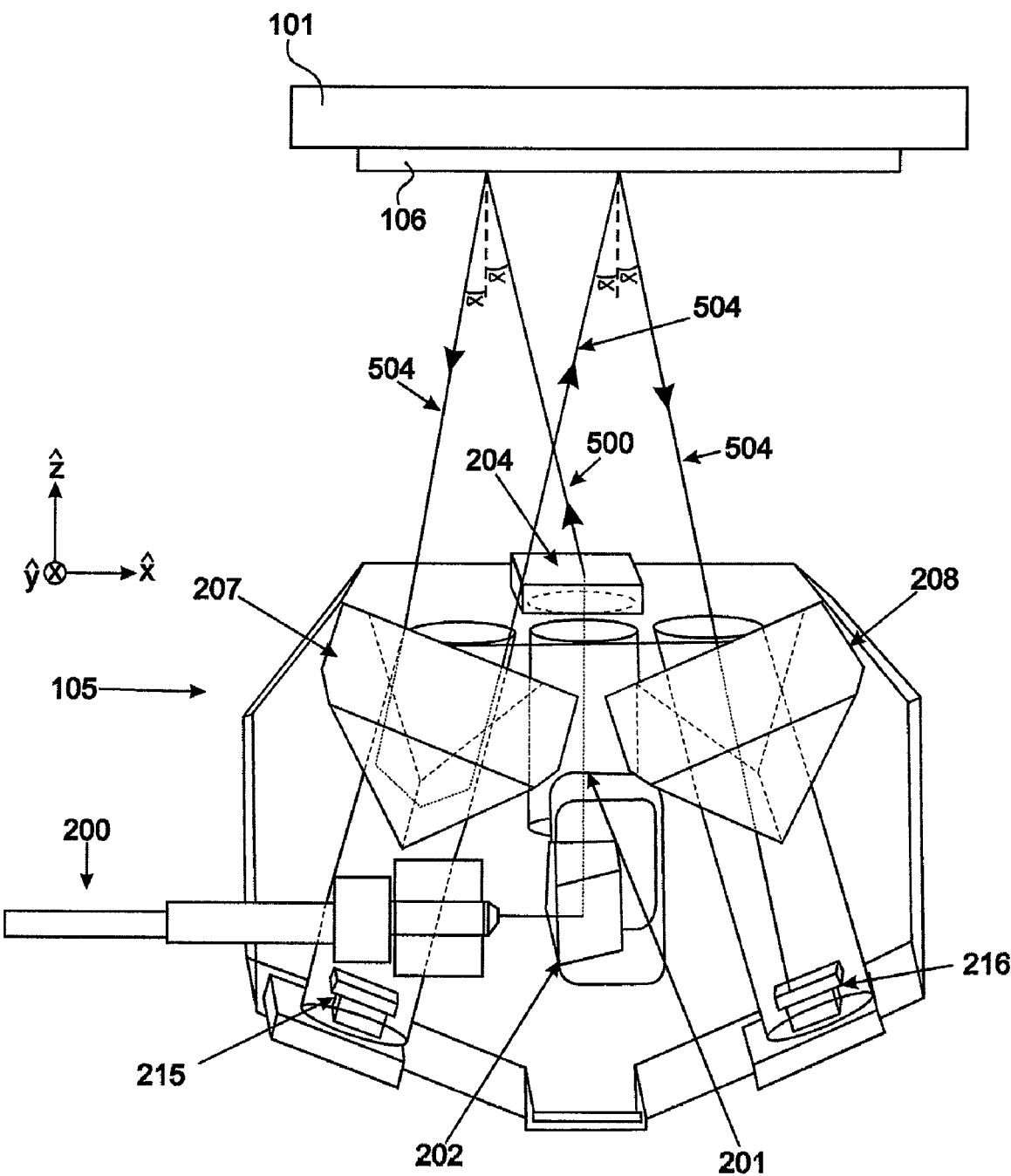

Turning to FIG. 5D, the measurement grating 106 subjects a fourth portion of second measurement beam 500 to a zeroth order diffraction to provide a sub-beam 504. Measurement grating 106 reflects sub-beam 504 at an angle of reflection equal to angle of incidence α. The sub-beam 504 is retroreflected by first retroreflector 207 and emerges antiparallel as shown. The sub-beam 504 is incident a second time on the measurement grating 106 at an angle of incidence equal to angle of incidence α. The measurement grating subjects sub-beam 504 to a zeroth order diffraction in which sub-beam is reflected at an angle of reflection equal to angle of incidence α. The sub-beam 504 passes behind The second retroreflector 208 and is incident on the second detector array 216. A lens (not shown in FIG. 5D) may be used to focus sub-beam 504 on second detector array 216. The sub-beam 504 incident on the second detector 216 is referred to herein as a (0,0) sub-beam of the second measurement beam 500.

In the representative embodiments described in the parent application, the sub-beams were each subject only to two zeroth order diffractions or to two first order diffractions (i.e., the sub-beams were either (0,0) sub-beams or (1,1) sub-beams). As such, homodyne displacement detection required splitting the (0,0) and (1,1) beams using side gratings 205, 206 prior to incidence on respective detector arrays 215, 216 in order to obtain a directional sense of the change in position.

Applicants have discovered that in addition to the (0,0) and (1,1) sub-beams, sub-beams subject to two different orders of diffraction (i.e., (1,0) sub-beams and (0,1) sub-beams) can be used in homodyne displacement detection. Moreover, combinations of sub-beams having the same order of diffraction and different orders of diffraction can be used in homodyne displacement detection (i.e., (0,0) sub-beams, (1,0) sub-beams, (0,1) sub-beams, and (1,1) sub-beams). Among other benefits, in certain representative embodiments where the side gratings 205, 206 are not used, fewer parts are required, which reduces the cost of the sensor and the complexity of its assembly. Moreover, because a greater number of sub-beams are available for use in measurement detection according to representative embodiments, greater flexibility is provided for the designer.

Different considerations are paid depending on the selected sub-beams of the first and second measurement beams. For example, and as described more fully in connection with FIGS. 6A and 6B, in embodiments comprising only the (0,0) and (1,1) sub-beams or only the (1,0) and (0,1) sub-beams, the sub-beams need to be split into pairs by side gratings 205, 206 before being incident on the respective detector arrays 215, 216 to create quadrature signals in order to make a measurement. In embodiments in which all four of the sub-beams are characterized by different orders of diffraction, i.e., ((0,0), (1,1), (1,0), and (0,1)) are used for making a measurement, this splitting function is not required and the side gratings 205, 206 are not provided in the optical path.

In the embodiments described in the parent application, only sub-beams that have been subject only to first order diffraction (i.e., (1,1) sub-beams) or have been subject only to zeroth order diffraction (i.e., 0,0 sub-beams) were used in displacement measurement. As noted, Applicants have determined that displacement measurement and detection using sub-beams of the measurement beams where all sub-beams have been subject to a zeroth order diffraction and a first order diffraction (i.e., all sub-beams are (1,0) or (0,1) sub-beam) may also be used as well. Presently, a mathematical treatment will be provided to show that the results are identical.

For the first measurement beam 400 (beam 'A' for the purposes of the following analysis) of wavelength λ, the Doppler frequency shift of the (1,1) sub-beam subject only to first order diffraction can be represented by:

$$fA11 = -\frac{2(\sin\alpha + \sin\beta)Vx + 2(\cos\alpha + \cos\beta)Vz}{\lambda}$$

For the first measurement beam 400, the Doppler shift for the (0,0) sub-beam subject only to zeroth order diffraction, the Doppler shift can be represented by:

$$fA00 = -\frac{4(\cos\alpha)Vz}{\lambda}$$

The resultant beat frequency for the first measurement beam is given by:

$$fAg = (fA11 - fA00) = -\frac{2(\sin\alpha + \sin\beta)Vx}{\lambda} + \frac{2(\cos\alpha - \cos\beta)Vz}{\lambda}$$

By similar analysis, the Doppler Shift for the second measurement beam 500 (beam 'B' for the purposes of the present analysis) having (1,1) sub-beams and (0,0) sub-beams (e.g., sub-beams 502, 504) can be represented respectively by:

$$fB11 = \frac{2(\sin\alpha + \sin\beta)Vx - 2(\cos\alpha + \cos\beta)Vz}{\lambda}$$

$$fB00 = -\frac{4(\cos\alpha)Vz}{\lambda}$$

The resultant beat frequency for the second measurement beam is:

$$fBg = (fB11 - fB00) = \frac{2(\sin\alpha + \sin\beta)Vx}{\lambda} + \frac{2(\cos\alpha - \cos\beta)Vz}{\lambda}$$

Subtracting and adding these two beat frequencies give:

$$(fBg - fAg) = \frac{4(\sin\alpha + \sin\beta)Vx}{\lambda}$$

$$(fBg + fAg) = \frac{4(\cos\alpha - \cos\beta)Vz}{\lambda}$$

Notably, these expressions may then be integrated by replacing frequency by phase, Vx by X and Vz by Z to give equations for system sensitivity to x and z motion.

The same mathematical treatment can be used for sub-beams subject to 'mixed' diffraction, i.e., one zeroth-order diffraction and one first-order diffraction in either order. For the first measurement beam (1,0) and (0,1) sub-beams subject to mixed diffraction, the respective Doppler shifts are:

$$fA10 = \frac{-(\sin\alpha + \sin\beta)Vx - (\cos\alpha + 3\cos\beta)Vz}{\lambda}$$

$$fA01 = \frac{(\sin\alpha + \sin\beta)Vx - (3\cos\alpha + \cos\beta)Vz}{\lambda}$$

The beat frequency for the first measurement beam 400 is:

$$fAb = (fA10 - fA01) = \frac{-2(\sin\alpha + \sin\beta)Vx + 2(\cos\alpha - \cos\beta)Vz}{\lambda}$$

For the second measurement beam 500, the Doppler shifts for the (1,0) and (0,1) sub-beams are:

$$fB10 = \frac{(\sin\alpha + \sin\beta)Vx - (\cos\alpha + 3\cos\beta)Vz}{\lambda}$$

$$fB01 = -\frac{(\sin\alpha + \sin\beta)Vx + (3\cos\alpha + \cos\beta)Vz}{\lambda}$$

The beat frequency for the second measurement beam 500 is:

$$fBb = (fB10 - fB01) = \frac{2(\sin\alpha + \sin\beta)Vx + 2(\cos\alpha - \cos\beta)Vz}{\lambda}$$

Subtracting and adding these two beat frequencies give:

$$(fBb - fAb) = \frac{4(\sin\alpha + \sin\beta)Vx}{\lambda}$$

$$(fBb + fAb) = \frac{4(\cos\alpha - \cos\beta)Vz}{\lambda}$$

Thus, the results are identical when using sub-beams subject to 'mixed' diffraction and when using sub-beams subject only to zeroth order diffraction or first order diffraction. As such, the 'mixed' sub-beams alone may be used to determine displacement in keeping with the present teachings.

In order to Facilitate understanding of the embodiments, certain examples are provided. These examples are merely for purposes of illustrating aspects of particular embodiments. In particular, any two sub-beams of each of the first and second measurement beams 400,500 are used in displacement measurements according to representative embodiments. As should be appreciated, a number of combinations of sets of sub-beams of the first and second measurement beams are possible, and descriptions of all such combinations are not provided. However, based on the detailed description, such combinations and equivalents thereof should be apparent.

Optical retarders (e.g., polarizers) may be provided in the optical path of certain ones of the sub-beams to create quadrature signals needed to define direction sense. Notably, like the embodiments described in the parent application that optical retarders are required to provide quadrature signals in representative embodiments of the present teachings.

EXAMPLE I

In the present example, reference is made to features described in connection with FIGS. 4A-5D. As such, review of these drawings in conjunction with the description of the present example is beneficial.

In a first example, some sub-beams of the first and second measurement beams 400, 500 are subject to both a zeroth order diffraction and a first order diffraction. Other sub-beams of the first and second measurement beams 400, 500 are subject only to zeroth order diffractions or first order diffractions. Two sub-beams are incident on each detector array, 215, 216. Thus, in the present example, the side gratings 205, 206 are neither required nor included. The position of the measurement grating 106 and the components of the sensor head 105 arranged such that desired pairs of sub-beams are incident co-axially and co-bore on appropriate detector elements (not shown in FIGS. 4A-5D) of the detector arrays 215, 216. In the present example, optical retarders (not shown in FIGS. 4A-5D) are placed in the path of respective co-axial and co-bore sub-beams.

At each of the detector elements, the incident sub-beams interfere to create a respective optical signal whose intensity varies as the position of the measurement grating 106 changes in the x- and z-directions with respect to the sensor head 105 where the x and z directions are defined in FIG. 2. The detector element converts the optical signal to an electrical signal whose amplitude represents the intensity of the optical signal. A signal processor (not shown) receives the electrical signals from the sensor heads 105 and from them determines a displacement of the measurement grating in the x-direction and the z-direction.

Illustratively, sub-beam 401 of the first measurement beam 400 and sub-beam 404 of the first measurement beam 400 are directed co-axially and co-bore from the measurement grating 106 to first detector array 215 where they interfere to create an optical signal the intensity of which is related to x and z position of the measurement grating, 106, relative to the sensor head 105. These sub-beams are subject only to zeroth-order (0,0) diffraction and only to first-order (1,1) diffraction, respectively.

Sub-beam 402 of the first measurement beam 400 and sub-beam 403 of the first measurement beam 400 are directed co-axially and co-bore from the measurement grating 106 to second detector array 216 where they interfere to create an optical signal having an intensity related to the x and z position of the grating 106 relative to the sensor head 105. These sub-beams are subject to zeroth-order and first-order (0,1) diffraction and to first-order and zeroth-order (1,0) diffraction, respectively.

Sub-beam 502 of the second measurement beam 500 and sub-beam 504 of the second measurement beam 500 are directed co-axially and co-bore from the measurement grating 106 to second detector array 216 where they interfere to create an optical signal whose intensity is related to the x and z position of the grating 106 relative to the sensor head 105. These sub-beams are subject only to first-order (1,1) diffraction and to zeroth-order (0,0) diffraction, respectively.

Sub-beam 501 of the second measurement beam 500 and sub-beam 503 of the second measurement beam 500 are directed co-axially and co-bore from the measurement grating 106 to the first detector array 215 where they interfere to create an optical signal whose intensity is related to the x and z position of the grating, 106, relative to the sensor head 105. These sub-beams are subject to first-order and zeroth-order (1, 0) diffraction and to zeroth-order and first-order (0,1) diffraction, respectively.

EXAMPLE II

Figure 6A:
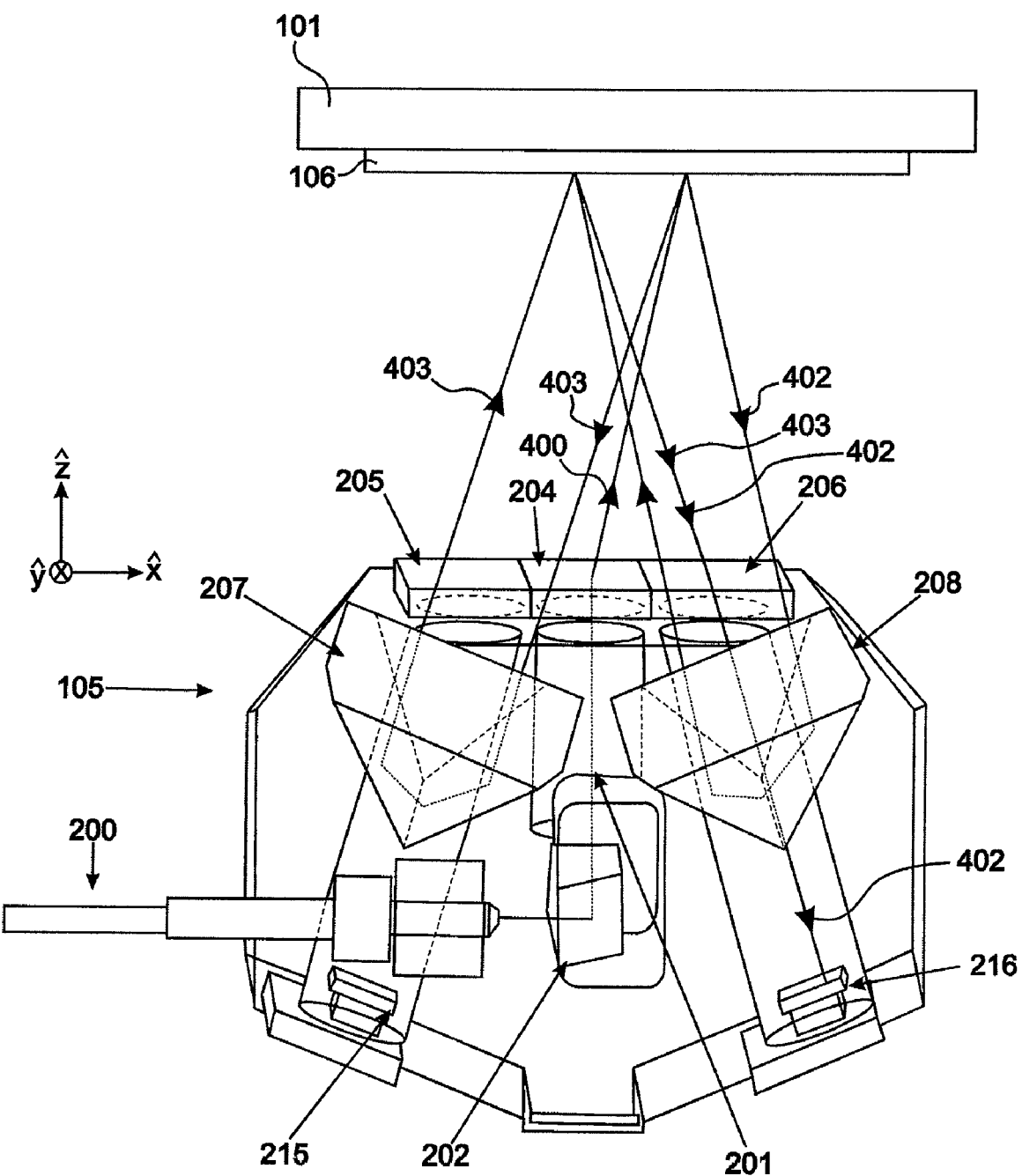
FIG. 6A-6B show a scanner head (shown in partial cut-away), a measurement grating and the optical paths of measurement sub-beams in accordance with a representative embodiment.
Figure 6B:
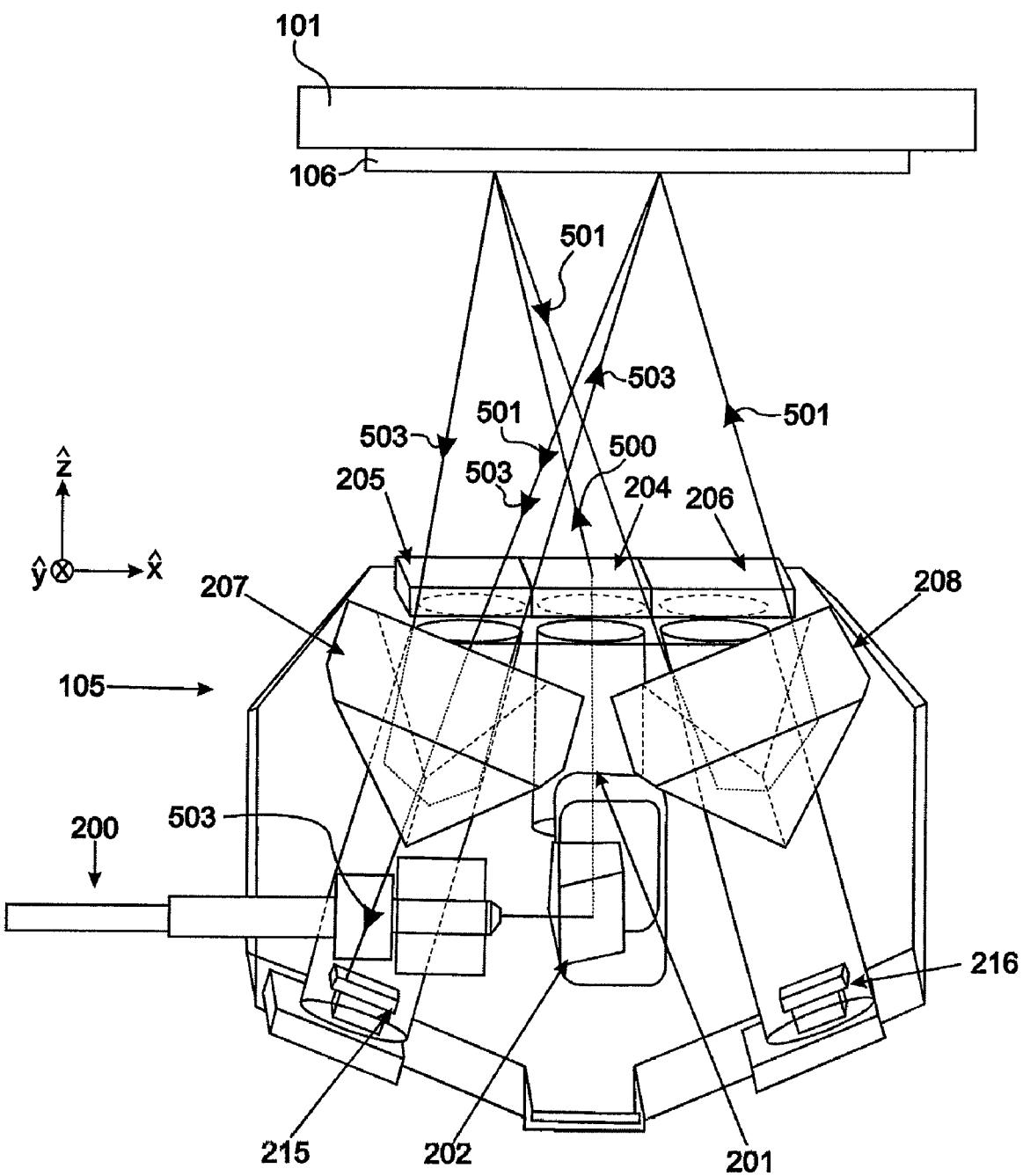

To further aide in the understanding of a second example, specific reference is made to FIGS. 6A and 6B. As should be appreciated, FIGS. 6A and 6B comprise selected sub-beams of measurement beams 400, 500 described in connection with FIGS. 4A-5D. The selected sub-beams are illustrative and it is emphasized that other combinations of sub-beams are contemplated.

In the second example, all sub-beams of the First and second measurement beams 400, 500 are subject to a zeroth order diffraction and a first order diffraction. Like embodiments comprising only sub-beams subject only to zeroth order diffraction or only to first order diffraction described in connection with embodiments of the parent application, in embodiments in which each sub-beam is subject to a zeroth order diffraction and a first order diffraction, side gratings 205, 206 are used to effect the needed beam splitting to ensure that two sub-beams are incident on each detector array 215, 216.

FIG. 6A shows sub-beam 402 of the first measurement beam 400 and sub-beam 403 of the first measurement beam 400 undergo two diffractions each at measurement grating 106 as described above. Sub-beams 402, 403 are directed co-axially and co-bore from the measurement grating 106 to the second side grating 206 as shown. The second side grating 206 diffracts sub-beams 402, 403 in different directions and the sub-beams 402, 403 are incident on optical retarders (not shown) and ultimately on the second detector array 216. Notably, only one of the sub-beams 402 can be seen in FIG. 6A. The path of the sub-beams 402, 403 is explained in greater detail in connection with FIG. 7.

FIG. 6B shows sub-beam 501 of the second measurement beam 500 and sub-beam 503 of the second measurement beam 500 undergo two diffractions each at measurement grating 106 as described above. Sub-beams are directed co-axially and co-bore from the measurement grating 106 to the first side grating 205 as shown. The first side grating 205 diffracts each sub-beam 501, 502 and the sub-beams are incident on optical retarders (not shown in FIG. 6A) and ultimately on the first detector array 215. Again, only one of the sub-beams 503 can be seen in FIG. 6B. The path of the sub-beams 501, 503 is explained in greater detail in connection with FIG. 7.

In the present example, because sub-beams 402, 403 and 501, 503 must be diffracted in different directions ('split') toward respective detector arrays 215, 216 to provide the required number of sub-beams to create quadrature signals in order to make a measurement, side grating 205 and side grating 206 are used for splitting sub-beams 403, 503, respectively. The splitting of the co-linear and co-bore sub-beams 402, 403 and 501, 503 by gratings 205, 206, respectively, is substantially identical to the description provided in the parent application in connection with the splitting of the zeroth order (0,0) and first order sub-beams (1,1); and as described in connection with FIG. 7 herein.

Certain details are not repeated in order to avoid obscuring the presently described embodiments. Notably, however, because of the need to split the co-linear and co-bore sub-beams 402, 403 and 501, 503 by gratings 205, 206, respectively, elements of the detector arrays 215, 216 (in the present example) are placed at a +y coordinate and a −y coordinate relative to the coordinate system shown in FIGS. 4A-5D. In particular, with the plane of the page of each drawing being the x-z plane, after separating the sub-beams components with respective gratings, the beams are directed to points with positive y-coordinates and negative y-coordinates (i.e., on the near side and the far side of the page of the drawings). First and second sub-beams of the first and second measurement beams 400, 500 are incident on each of the detector arrays 215, 216 and the needed two pairs of interfering sub-beams at each of the two detector arrays for displacement measurements in accordance with the present teachings are provided. Notably, the four pairs of sub-beams comprise both sub-beams with both a zeroth order diffraction component and a first order diffraction component.

With specific reference again to FIG. 3 of the drawings, there is shown a side view representation of the sensor head and the beam path of the first and second measurement channels 400, 500 in the y-z plane. Both sub-beams 401, 402 and 501, 502 of both measurement channels 400, 500 align in the y-z plane. In a specific embodiment, the reflected and diffracted beams are incident to the measurement grating 106 at angle ϕ in the y-z plane and reflect/diffract at angle ϕ in the y-z plane. Reflection and diffraction in the x-z plane is as described with respect to FIGS. 4A-5D. Altering the angle ϕ in the y-z plane does not change the definitions of the angles α and β in the x-z plane.

Figure 7:
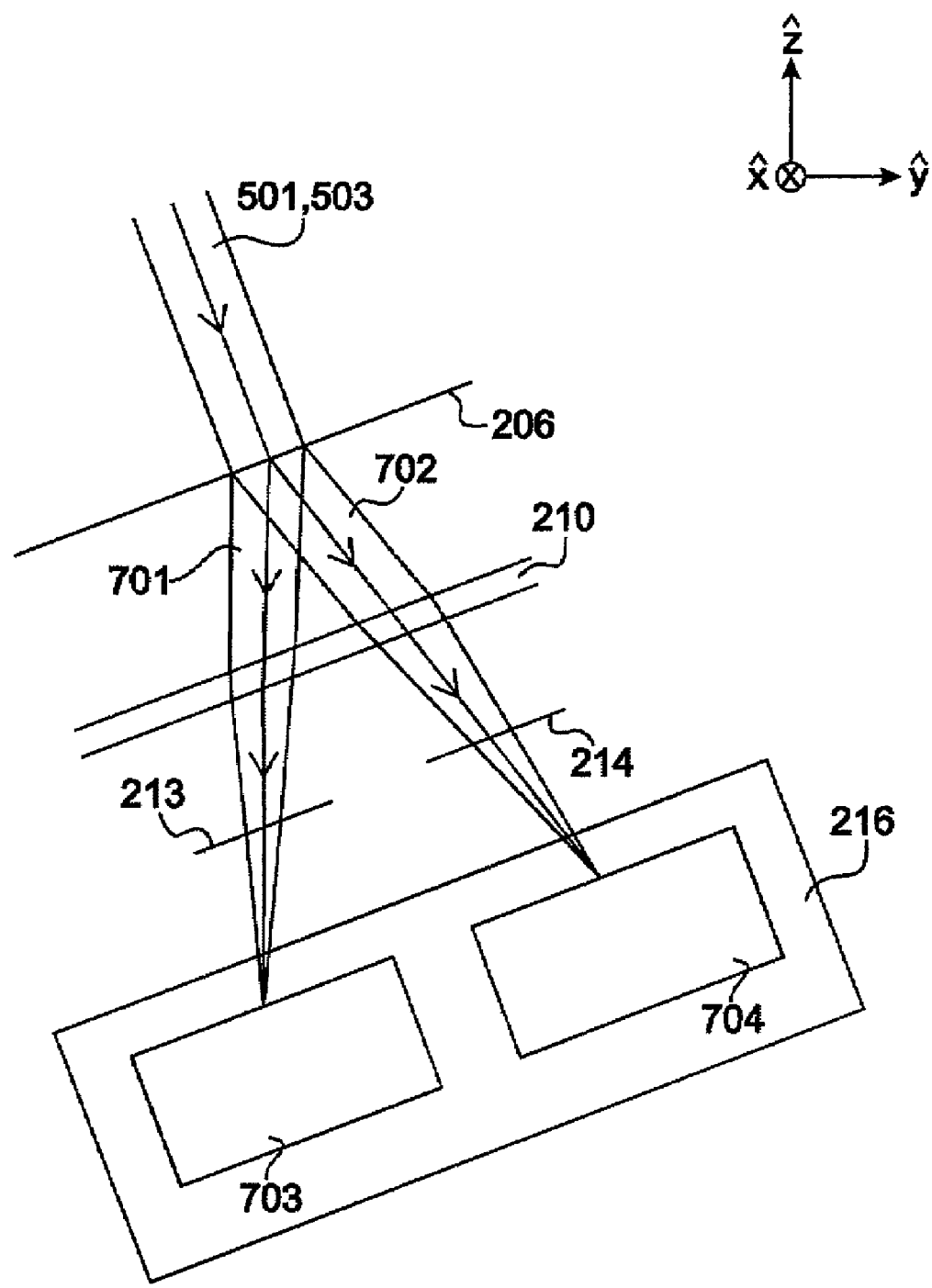
FIG. 7 is a more detailed view of a portion of sub-beams in according to the representative embodiment of FIG. 6B.

FIG. 7 shows a more detailed illustration of a sub-beam path in accordance with a representative embodiment. Specifically, FIG. 7 illustrates the separating of sub-beams 501, 503 described in conjunction with Example II in the y-z plane after the second measurement channel 500 is incident on the side grating 206, so that the sub-beams are incident on different portions of the detector array 216. The first measurement channel 400 comprising sub-beams 402, 403 in Example II follow a similar beam path through respective elements associated with it. Accordingly, one of ordinary skill in the art is able to reproduce the beam path for the first channel 400 given benefit of the beam path for the second channel 500.

The second measurement channel 500 is incident on the second side grating 206. The second side grating 206 splits the light into first and second detector beams 701, 702 that emerge from the side grating 206 in the y-z plane. In certain cases, it is beneficial to use a relatively large diameter beam to obtain a larger operational range of stage translation and rotation and to average out spatial frequency errors in the measurement grating 106. A pitch of the side gratings 205, 206 is chosen for convenience and depends upon a desired angle of split. A larger beam diameter calls for a larger split angle for the same amount of distance between the side grating and the next element the beam is incident on. If a large diameter beam is used, each detector beam 701, 702 may optionally be focused by lens 210. Each focused beam 701, 702 then passes through respective first and second polarizer/retarders 213, 214 that provide a constant phase offset. In a specific embodiment, the constant phase offset can be substantially 90 degrees between the first and second detector beams 701, 702 before impinging detector array 216.

In a specific homodyne embodiment, the detector array 216 comprises first and second detector elements 703, 704 for each beam detected. Each detector beam 701, 702 has a dynamic phase difference, or a phase difference that changes with position of the measurement grating 106 relative to the sensor head 105. The dynamic phase difference is common to all signals from one side grating. Each detector beam 701, 702 also has a constant phase difference which is independent of every other signal from one side grating. Homodyne systems benefit from at least two detector beams in order to maintain directional sense of the change in position. A larger number of detectors may be appropriate for alternative embodiments in which case the polarizer/retarders for each beam will have a constant phase difference that is appropriate for the number of detectors. In the case of N detectors, where N>2, the phase difference between the adjacent detectors could be equal to 360/N degrees. In a heterodyne embodiment, there may be a single detector element in the detector array 215, 215 or 216, 216.

Electronics connected to the sensor heads 105 extract the dynamic portion of the phase difference measured at each detector array 215, 215 or 216, 216. Because there are two measurement channels 400, 500, there are two phase differences to be measured for each sensor head 105. The two phase differences are expressed as $N_A$ and $N_B$, where $N_A$ and $N_B$ are in units of waves. The position of the sensor head 105 with respect to the measurement grating 106 is given by the following equations:

$$x = \frac{p}{4}(N_B - N_A)$$

$$z = \frac{p}{4}(N_B + N_A)\cot\frac{1}{2}(\beta - \alpha)$$

where p is the measurement grating pitch, $\alpha$ is the angle between the beam from the splitter grating and the measurement grating normal, and $\beta$ is the angle between the diffraction path and the measurement grating normal.

Precision position measurement of a stage with Abbe error compensation optimally makes a measurement of at least six degrees of freedom, translation along the X, Y and Z axes as well as rotations about the X, Y and Z axes. The sensor head 105 according to the present teachings may be used to measure two degrees of freedom, specifically translation along the X and Z axes. In another embodiment according to the present teachings that also measures rotation about the Y and Z axes, a second sensor head is placed in a separate location so that a separate light beam is incident on either the same measurement grating 106 as the first sensor head or a second independent measurement grating having a pitch aligned along a same axis. For example, if the light beam from the first sensor head 105 is incident on the measurement grating 106 having a pitch aligned along the X axis, the second sensor head generates a light beam that is incident on the same measurement grating 106 or a separate measurement grating having a pitch aligned along the X axis.

A location of the second sensor head may be chosen such that measurements from the first and second sensor head can be combined to measure translations in X and Z directions along with rotations about Y and Z directions. A third sensor head can deliver the remaining Y direction translation and rotation about the X axis if the third sensor head is rotated approximately 90 degrees about the Z axis with respect to the first two sensor heads and is incident on a measurement grating with a pitch along the Y axis. This y direction measurement grating may be a separate optic from the measurement grating(s) impinged by the first two sensor heads, or it may be the same grating that not only has a pitch along the X axis but also a pitch along the Y axis. In this configuration, all sensor heads operate similarly and measure light beams that are diffracted from the grating pitch parallel to the direction of motion. In yet another embodiment, the measurement gratings have pitches along non orthogonal directions.

Figure 8:
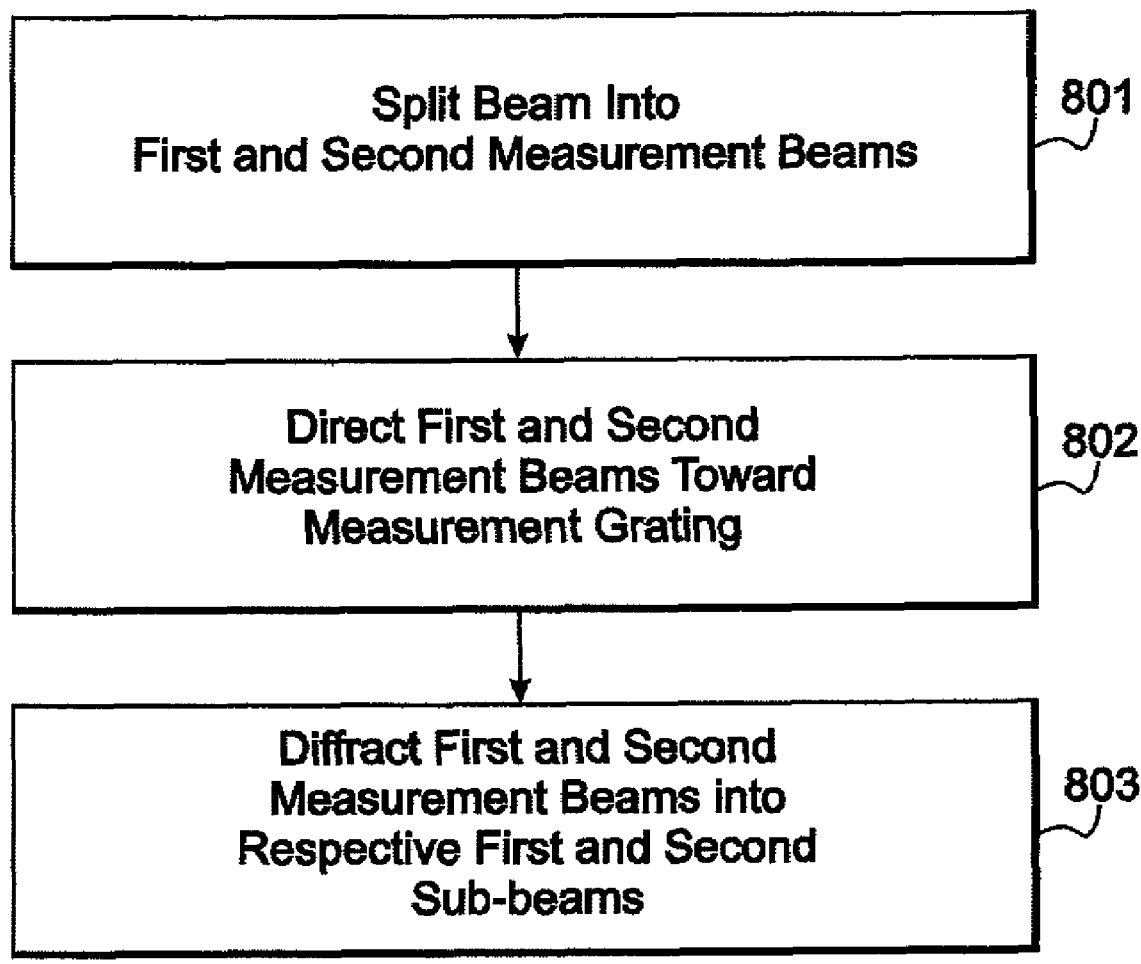
FIG. 8 is a flow-chart of a method of measuring a displacement in accordance with a representative embodiment.

FIG. 8 is a flow-chart of a method of measuring a displacement according to a representative embodiment. The method may be implemented with the sensor head 105 and measurement system described in accordance with representative embodiments above.

At 801, the method comprises splitting a light beam into first and second measurement beams. At 802 the method comprises directing the first measurement beam and the second measurement beam toward a measurement grating. At 803, the method comprises diffracting the first and second measurement beams into respective first and second sub-beams. In a representative embodiment one of the sub-beams comprises a zeroth-order diffraction component and a first order diffraction component.

In view of this disclosure it is noted that variations to the displacement measurement sensor head, system and method of use described herein can be implemented in keeping with the present teachings. Further, the various devices, components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

We claim:

1. A sensor head for use with a measurement grating, the sensor head comprising:
   a splitter grating configured to split a light beam into first and second measurement beams;
   a first retroreflector configured to retroreflect the first and second measurement beams toward the measurement grating; and
   a second retroreflector configured to retroreflect the first and second measurement beams toward the measurement grating, wherein the second measurement beam is diffracted by the measurement grating to form first and second sub-beams and one of the first and second sub-beams comprises a zeroth order diffraction component and a first order diffraction component.

2. A sensor head as claimed in claim 1, wherein the first measurement beam is diffracted by the measurement grating to form first and second sub-beams and one of the first and second sub-beams of the first measurement beam comprises only zeroth order diffraction components.

3. A sensor head as claimed in claim 1, wherein the first measurement beam is diffracted by the measurement grating to form first and second sub-beams and one of the first and second sub-beams of the first measurement beam comprises only first order diffraction components.

4. A sensor head as claimed in claim 1, wherein the other of the first and second sub-beams of the second measurement beam comprises a zeroth order diffraction component and a first order diffraction component.

5. A sensor head as claimed in claim 1, wherein the other of the first and second sub-beams of the second measurement beam comprises only zeroth order diffraction components or first order diffraction components.

6. A sensor head as claimed in claim 1, further comprising a first detector array and a second detector array, wherein the first and second detector arrays are adapted to receive the beams diffracted from the measurement grating.

7. A sensor head as claimed in claim 6, wherein the detector arrays measure a phase difference for the first and second measurement beams represented as $N_A$ and $N_B$ and an x-displacement is calculated as:

$$x = \frac{p}{4}(N_B - N_A);$$

and a z-displacement is calculated:

$$z = \frac{p}{4}(N_B + N_A)\cot\frac{1}{2}(\beta - \alpha),$$

wherein p is a pitch of the measurement grating, α is an angle of incidence and β is an angle of diffraction.

8. A measurement system for measuring a displacement comprising a sensor head as claimed in claim 1.

9. A measurement system for measuring a displacement comprising a sensor head as claimed in claim 2.

10. A measurement system for measuring a displacement comprising a sensor head as claimed in claim 3.

11. A sensor head for use with a measurement grating, the sensor head comprising:
   a splitter grating configured to split a light beam into first and second measurement beams;
   a first retroreflector configured to retroreflect the first and second measurement beams toward the measurement grating; and
   a second retroreflector configured to retroreflect the first and second measurement beams toward the measurement grating, wherein the first and second measurement beams are diffracted by the measurement grating to form respective first and second sub-beams of each of the first and second measurement beams and the first and second sub-beams each comprise a zeroth order diffraction component and a first order diffraction component.

12. A sensor head as claimed in claim 11, further comprising a first detector array and a second detector array, wherein the first and second detector arrays are adapted to receive the beams diffracted from the measurement grating.

13. A sensor head as claimed in claim 12, wherein the detector arrays measure a phase difference for the first and second measurement beams represented as $N_A$ and $N_B$ and an x-displacement is calculated as:

$$x = \frac{p}{4}(N_B - N_A)$$

and a z-displacement is calculated:

$$z = \frac{p}{4}(N_B + N_A)\cot\frac{1}{2}(\beta - \alpha)$$

wherein p is a pitch of the measurement grating, α is an angle of incidence and β is an angle of diffraction.

14. A sensor head for use with a measurement grating, the sensor head comprising:
   a splitter grating configured to split a light beam into first and second measurement beams;
   a first retroreflector configured to retroreflect the first and second measurement beams toward the measurement grating; and
   a second retroreflector configured to retroreflect the first and second measurement beams toward the measurement grating, wherein the first and second measurement beams are diffracted by the measurement grating to form respective first and second sub-beams of each of the first and second measurement beams and the first and second sub-beams each comprise only zeroth order diffraction components or first order diffraction components.

15. A sensor head as claimed in claim 14, further comprising a first detector array and a second detector array, wherein the first and second detector arrays are adapted to receive the beams diffracted from the measurement grating.

16. A sensor head as claimed in claim 15, wherein the detector arrays measure a phase difference for the first and second measurement beams represented as $N_A$ and $N_B$ and an x-displacement is calculated as:

$$x = \frac{p}{4}(N_B - N_A);$$

and a z-displacement is calculated:

$$z = \frac{p}{4}(N_B + N_A)\cot\frac{1}{2}(\beta - \alpha),$$

wherein p is a pitch of the measurement grating, α is an angle of incidence and β is an angle of diffraction.

17. A measurement system for measuring a displacement comprising a sensor head as claimed in claim 14.

18. A method of measuring a displacement, the method comprising:
   splitting a light beam into first and second measurement beams;
   directing the first measurement beam toward a measurement grating;
   directing the second measurement beam toward the measurement grating; and
   diffracting the first and second measurement beams into respective first and second sub-beams, wherein one of the sub-beams comprises a zeroth-order diffraction component and a first order diffraction component.

19. A method as claimed in claim 18, further comprising diffracting the first measurement beam to form first and second sub-beams wherein one of the first and second sub-beams of the first measurement beam comprises only zeroth order diffraction components.

20. A method as claimed in claim 18, further comprising diffracting the first measurement beam to form first and second sub-beams wherein one of the first and second sub-beams of the first measurement beam comprises only first order diffraction components.

21. A method as claimed in claim 18, wherein the other of the sub-beams of the second measurement beam comprises a first order diffraction component and a second order diffraction component.

* * * * *